(12) United States Patent
Eldada

(10) Patent No.: US 10,180,493 B2
(45) Date of Patent: *Jan. 15, 2019

(54) THREE-DIMENSIONAL-MAPPING TWO-DIMENSIONAL-SCANNING LIDAR BASED ON ONE-DIMENSIONAL-STEERING OPTICAL PHASED ARRAYS AND METHOD OF USING SAME

(71) Applicant: Quanergy Systems, Inc., Sunnyvale, CA (US)

(72) Inventor: Louay Eldada, Sunnyvale, CA (US)

(73) Assignee: Quanergy Systems, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/854,614

(22) Filed: Dec. 26, 2017

(65) Prior Publication Data

US 2018/0136317 A1 May 17, 2018

Related U.S. Application Data

(63) Continuation of application No. 14/460,369, filed on Aug. 15, 2014, now Pat. No. 9,869,753.

(51) Int. Cl.
| | | |
|---|---|---|
| *G01S 7/48* | (2006.01) | |
| *G01S 7/481* | (2006.01) | |
| *G01S 17/89* | (2006.01) | |
| *G01S 17/10* | (2006.01) | |
| *G01S 17/42* | (2006.01) | |
| *H01S 5/00* | (2006.01) | |

(52) U.S. Cl.
CPC .......... *G01S 7/4814* (2013.01); *G01S 7/4817* (2013.01); *G01S 17/10* (2013.01); *G01S 17/42* (2013.01); *G01S 17/89* (2013.01); *G01S 7/4815* (2013.01); *H01S 5/0071* (2013.01)

(58) Field of Classification Search
CPC .... A61B 6/03; G01C 3/08; G01N 2021/1787; G01N 21/17; G01B 9/02069
See application file for complete search history.

(56) References Cited

U.S. PATENT DOCUMENTS

| | | | |
|---|---|---|---|
| 3,064,252 | A | 11/1962 | Varela |
| 3,636,250 | A | 1/1972 | Haeff |
| 3,781,111 | A | 12/1973 | Fletcher et al. |
| 3,781,552 | A | 12/1973 | Kadrmas |
| 3,897,150 | A | 7/1975 | Bridges et al. |

(Continued)

FOREIGN PATENT DOCUMENTS

| | | |
|---|---|---|
| JP | H-3-6407 A | 1/1991 |
| JP | 2006-177843 A | 7/2006 |

OTHER PUBLICATIONS

Aull, B.F. et al. (2002). "Geiger-mode avanlanche photodiodes for three-dimensional imaging," Lincoln Labora. J. 13:335-350.

(Continued)

*Primary Examiner* — Luke D Ratcliffe
(74) *Attorney, Agent, or Firm* — Cooley LLP

(57) ABSTRACT

A plurality of one-dimensional planar beam forming and steering optical phased array chips form a two-dimensional-scanning solid-state lidar, enabling manufacturing of three-dimensional mapping time-of-flight lidars at high yield and low cost resulting from the simplicity of said one-dimensional optical phased array chips.

6 Claims, 2 Drawing Sheets

(56) References Cited

U.S. PATENT DOCUMENTS

| | | | |
|---|---|---|---|
| 4,179,216 A | 12/1979 | Theurer et al. | |
| 4,477,184 A | 10/1984 | Endo | |
| 4,952,911 A | 8/1990 | D'Ambrosia et al. | |
| 5,132,843 A | 7/1992 | Aoyama et al. | |
| 5,210,586 A | 5/1993 | Grage et al. | |
| 5,455,669 A | 10/1995 | Wetteborn | |
| 5,543,805 A | 8/1996 | Thaniyavarn | |
| 5,552,893 A | 9/1996 | Akasu | |
| 5,682,229 A | 10/1997 | Wangler | |
| 5,691,687 A | 11/1997 | Kumagai et al. | |
| 5,877,688 A | 3/1999 | Morinaka et al. | |
| 5,898,483 A | 4/1999 | Flowers | |
| 5,898,491 A | 4/1999 | Ishiguro et al. | |
| 6,765,663 B2 | 7/2004 | Byren et al. | |
| 6,891,987 B2 | 5/2005 | Ionov et al. | |
| 7,030,968 B2 | 4/2006 | D'Aligny et al. | |
| 7,190,465 B2 | 3/2007 | Froehlich et al. | |
| 7,281,891 B2 | 10/2007 | Smith et al. | |
| 7,339,727 B1 | 3/2008 | Rothenberg et al. | |
| 7,406,220 B1 | 7/2008 | Christensen et al. | |
| 7,428,100 B2 | 9/2008 | Smith et al. | |
| 7,436,588 B2 | 10/2008 | Rothenberg et al. | |
| 7,489,870 B2 | 2/2009 | Hillis et al. | |
| 7,532,311 B2 | 5/2009 | Henderson et al. | |
| 7,555,217 B2 | 6/2009 | Hillis et al. | |
| 7,746,449 B2 | 6/2010 | Ray et al. | |
| 7,969,558 B2 | 6/2011 | Hall | |
| 8,125,367 B2 | 2/2012 | Ludwig | |
| 8,203,115 B2 | 6/2012 | Hochberg et al. | |
| 8,311,374 B2 | 11/2012 | Hochberg et al. | |
| 8,731,247 B2 | 5/2014 | Pollock | |
| 8,836,922 B1 | 9/2014 | Pennecot et al. | |
| 8,988,754 B2 | 3/2015 | Sun et al. | |
| 9,014,903 B1 | 4/2015 | Zhu et al. | |
| 9,069,080 B2 | 6/2015 | Stettner et al. | |
| 9,104,086 B1 | 8/2015 | Davids et al. | |
| 9,383,753 B1 | 7/2016 | Templeton et al. | |
| 9,753,351 B2 | 9/2017 | Eldada | |
| 2005/0033497 A1 | 2/2005 | Stopczynski | |
| 2006/0091303 A1 | 5/2006 | Evans | |
| 2006/0091305 A1 | 5/2006 | Grunnet-Jepsen et al. | |
| 2006/0197936 A1 | 9/2006 | Libeman et al. | |
| 2006/0239688 A1* | 10/2006 | Hillis | B82Y 20/00 398/116 |
| 2007/0052947 A1 | 3/2007 | Ludwig et al. | |
| 2007/0181810 A1 | 8/2007 | Tan et al. | |
| 2008/0002176 A1 | 1/2008 | Krasutsky | |
| 2008/0094607 A1 | 4/2008 | Bernard et al. | |
| 2008/0186470 A1 | 8/2008 | Hipp | |
| 2008/0204699 A1 | 8/2008 | Benz et al. | |
| 2008/0227292 A1 | 9/2008 | Miki | |
| 2009/0059201 A1 | 3/2009 | Willner et al. | |
| 2009/0251680 A1 | 10/2009 | Farsaie | |
| 2009/0278030 A1 | 11/2009 | Deliwala | |
| 2010/0045964 A1 | 2/2010 | Jin et al. | |
| 2010/0187402 A1 | 7/2010 | Hochberg et al. | |
| 2010/0187442 A1 | 7/2010 | Hochberg et al. | |
| 2010/0253585 A1 | 10/2010 | Llorens del Rio et al. | |
| 2010/0271614 A1 | 10/2010 | Albuquerque et al. | |
| 2010/0290029 A1 | 11/2010 | Hata | |
| 2011/0216304 A1 | 9/2011 | Hall | |
| 2011/0222814 A1 | 9/2011 | Krill et al. | |
| 2011/0255070 A1 | 10/2011 | Phillips et al. | |
| 2011/0316978 A1 | 12/2011 | Dillon et al. | |
| 2012/0013962 A1 | 1/2012 | Subbaraman et al. | |
| 2012/0226118 A1 | 9/2012 | Delbeke et al. | |
| 2012/0286136 A1 | 11/2012 | Krill et al. | |
| 2013/0027715 A1 | 1/2013 | Imaki et al. | |
| 2013/0044309 A1 | 2/2013 | Dakin et al. | |
| 2013/0114924 A1 | 5/2013 | Loh et al. | |
| 2013/0127980 A1 | 5/2013 | Haddick et al. | |
| 2013/0208256 A1 | 8/2013 | Mamidipudi et al. | |
| 2013/0242400 A1 | 9/2013 | Chen | |
| 2013/0301976 A1 | 11/2013 | Saida et al. | |
| 2014/0152871 A1 | 6/2014 | Campbell et al. | |
| 2014/0211194 A1 | 7/2014 | Pacala et al. | |
| 2014/0240691 A1 | 8/2014 | Mheen | |
| 2014/0376001 A1 | 12/2014 | Swanson | |
| 2015/0192677 A1 | 7/2015 | Yu et al. | |
| 2015/0293224 A1 | 10/2015 | Eldada et al. | |
| 2015/0346340 A1 | 12/2015 | Yaacobi et al. | |
| 2015/0378241 A1 | 12/2015 | Eldada | |
| 2016/0047901 A1 | 2/2016 | Pacala et al. | |
| 2016/0049765 A1 | 2/2016 | Eldada | |
| 2016/0161600 A1 | 6/2016 | Eldada et al. | |

OTHER PUBLICATIONS

Avalanche Photodiode (2011). User Guide. Excelitas Technologies. 8 total pages.

American National Standard for Safe Use of Lasers (2000). ANSI. ANSI Z136.1—2000.

The American Heritage Dictionary (1996). Third edition. Houghton Mifflin Company. pp. 1497, 1570, 1697, 1762 and 1804.

Besl, P.J. (1988). "Active, optical range imaging sensors," Mach. Vision Applic. 1:127-152.

Bordone, A. et al. (2003). "Development of a high resolution laser radar for 3D imaging in artwork cataloguing," SPIE 5131:244-248.

Code of Federal Regulations (2005). Parts 800 to 1299. 21 C.F.R. Section 1040.10, 23 total pages.

Doylend et al. (2012). "Hybrid III/V silicon photonic source with integrated 1D free-space beam steering," Optics Letters 37:4257-4259.

Extended European Search Report dated Jan. 26, 2018, for EP Application No. 15 830 163.0, filed on Jun. 23, 2015, 10 pages.

Extended European Search Report dated Mar. 12, 2018, for EP Application No. 15 832 162.0, filed on Aug. 6, 2015, 10 pages.

File History for U.S. Pat. No. 7,969,558, issued on Jun. 28, 2011, 274 total pages.

Guo et al., (2013). "Two-Dimensional optical Beam Steering with InP-Based Photonic Integrated Circuits", IEEE Journal of Selected Topics in Quantum Electronics 19:6100212, 12 total pages.

Gustavson, R.L. (1992). "Diode-laser radar for low-cost weapon guidance," Laser Radar VII 1633:21-32.

Jelalian, A.V. (1992). "Laser radar systems," 3 total pages.

Jie, S. et al. (2013). "Large-scale silicon photonic circuits for optical phased arrays," IEEE J. Selected Topics in Quantum Electronics 20:1-15.

Kamerman, G.W. (1993). Chapter 1: Laser radar. vol. 6. The infrared and electro-optical systems handbook. 4 total pages.

Kamerman, G.W. (1993). Chapter 1: Laser radar. vol. 6. The infrared and electro-optical systems handbook. 80 total pages.

Kawata, H. et al. (2005). "Development of ultra-small lightweight optical range sensor system," 7 total pages.

Kawata, H. et al. (2005). "Development of ultra-small lightweight optical range sensor system," 63 total pages.

Kilpela, A. et al. (2001). "Precise pulsed time-of-flight laser range finder for industrial distance measurements," Rev. Scientific Instruments 72:2197-2202.

LaserFocusWorld (1995). "How to select avalanche photodiodes," 9 total pages.

Manandhar, D. et al. (2002). "Auto-extraction of urban features from vehicle-borne laser data," 6 total pages.

Richmond, R.D. et al. (2005). "Polarimetric imaging laser radar (PILAR) program," Adv. Sens. Payloads for UAV 35 total pages.

Saleh, B.E.A. et al. (1991). Fundamentals of Photonics. John Wiley & Sons, Inc. 162 total pages.

Skolnik, M.I. (1980). "Introduction to radar systems," Second edition. McGraw-Hill Book Company. p. 7.

Skolnik, M.I. (1990). "Radar handbook," Second edition. McGraw-Hill Publishing Company. 1191 total pages.

Ullrich, A. et al. (1999). "High-performance 3D-imaging laser sensor," SPIE 3707:658-664.

Westinghouse (date unknown). AN/TPS-43E Tactical radar system, 14 total pages.

Guo et al., "InP Photonic Integrated Circuit for 2D Optical Beam Steering", Photonics Conference, Oct. 9-13, 2011, Arlington, VA, IEEE, 2011, 3 pgs.

(56) References Cited

OTHER PUBLICATIONS

Guo et al., "Two-Dimensional optical Beam Steering with InP-Based Photonic Integrated Circuits", IEEE Journal of Selected Topics in Quantum Electronics, vol. 19, No. 4, Aug. 2013, pp. 1, 6, 8, 11.

Hulme et al., "Fully Integrated Hybrid Silicon Free-Space Beam Steering Source with 32 Channel Phased Array", SPIE, Mar. 26, 2014, pp. 898907-2, 898907-13.

Intellectual Property Office of Singapore, Written Opinion issued to SG application No. 11201610963X, dated Oct. 5, 2017, 5 pgs.

Taillaert et al., "An Out-Of-Plane Grating Coupler for Efficient Butt-Coupling Between Compact Planar Waveguides and Single-Mode Fibers", IEEE Journal of Quantum Electronics, vol. 38, No. 7, Jul. 2002, pp. 951-953.

International Search Report and Written Opinion issued to International Patent Application No. PCT/US15/44069, dated Nov. 12, 2015, 9 pgs.

Van Acoleyen, Karel, "Nanophotonic Beamsteering Elements Using Silicon Technology for Wireless Optical Applications", Ghent University, Dept. of Information Technology, Aug. 27, 2012, 180 pgs.

Van Acoleyen, Karel, "Off-Chip Beam Steering with a One-Dimensional Optical Phased Array on Silicon-On-Insulator", Optics Letters, vol. 34, No. 9, May 1, 2009, pp. 1477-1479.

International Search Report and Written Opinion issued to international patent application No. PCT/US15/56516, dated Feb. 4, 2016, 7 pgs.

\* cited by examiner

THREE-DIMENSIONAL-MAPPING TWO-DIMENSIONAL-SCANNING LIDAR BASED ON ONE-DIMENSIONAL-STEERING OPTICAL PHASED ARRAYS AND METHOD OF USING SAME

CROSS REFERENCE TO RELATED APPLICATIONS

This application is a continuation of U.S. patent application Ser. No. 14/460,369 filed Aug. 15, 2014, the contents of which are incorporated herein by reference.

FIELD OF THE INVENTION

The present invention relates generally to the field of environment sensing, and more particularly to the use of Time of Flight (ToF) lidar sensors for real-time three-dimensional mapping and object detection, tracking, identification and/or classification.

BACKGROUND OF THE INVENTION

A lidar sensor is a light detection and ranging sensor. It is an optical remote sensing module that can measure the distance to a target or objects in a scene, by irradiating the target or scene with light, using pulses (or alternatively a modulated signal) from a laser, and measuring the time it takes photons to travel to said target or landscape and return after reflection to a receiver in the lidar module. The reflected pulses (or modulated signals) are detected, with the time of flight and the intensity of the pulses (or modulated signals) being measures of the distance and the reflectivity of the sensed object, respectively.

Conventional lidar sensors utilize mechanically moving parts for scanning laser beams. In some systems, including certain systems used in automotive applications, such as advanced driver assist systems (ADAS) and autonomous driving systems, it is preferred to use solid state sensors for a variety of potential advantages including but not limited to higher sensor reliability, longer sensor lifetime, smaller sensor size, lower sensor weight, and lower sensor cost.

Radio frequency (RF) delay lines used for the creation of radar phased arrays were used several decades ago for the solid state steering of radar signals. Photonic integrated circuit (PIC) based delay lines combined with detectors and RF antenna arrays were used two decades ago to improve the precision of delays in the solid state steering of radar signals. PICs with microscale and nanoscale devices can be used to produce optical phased arrays (OPAs), comprising tunable optical delay lines and optical antennas, for the solid state steering of laser beams.

Phased arrays in the optical domain that are produced to date are complex, costly and/or have a different purpose than beam forming and beam steering; some combine spatial filters, optical amplifiers and ring lasers (U.S. Pat. No. 7,339,727), some involve a plurality of optical input beams (U.S. Pat. No. 7,406,220), some involve volume diffraction gratings and a plurality of input directions (U.S. Pat. No. 7,428,100), some combine beams of a plurality of wavelengths (U.S. Pat. No. 7,436,588), some have optical phase reference sources and gain elements (U.S. Pat. No. 7,489,870), some have predetermined areas in the field of view and a plurality of beam forming elements (U.S. Pat. No. 7,532,311), and some have multiple frequencies and multiple optical phase reference sources (U.S. Pat. No. 7,555,217).

Two-dimensional beam forming and steering phased arrays in the optical domain that are produced to date have low yields and are costly because they steer in two dimensions with a complex two-dimensional pixel array.

SUMMARY OF THE INVENTION

A plurality of one-dimensional (1D) planar beam forming and steering optical phased array (OPA) chips form a two-dimensional (2D) scanning solid-state lidar, enabling manufacturing of three-dimensional (3D) mapping time-of-flight lidars at high yield and low cost resulting from the simplicity of said 1D OPA chips.

DESCRIPTION OF THE DRAWINGS

The following drawings are illustrative of embodiments of the present invention and are not intended to limit the invention as encompassed by the claims forming part of the application.

The schematic diagram of FIG. 1 depicts a plurality of 1D planar beam forming and steering optical phased array chips 10. The double-headed arrow 20 lies in the steering plane within the field of view. A graded-index (GRIN) lens 30 is used with each chip to reduce the spot size in the dimension perpendicular to the steering direction. Alternatively, a geometric refractive lens, a diffractive optical element (DOE), or a holographic optical element (HOE) could be used to achieve said spot size reduction.

Figure 1:
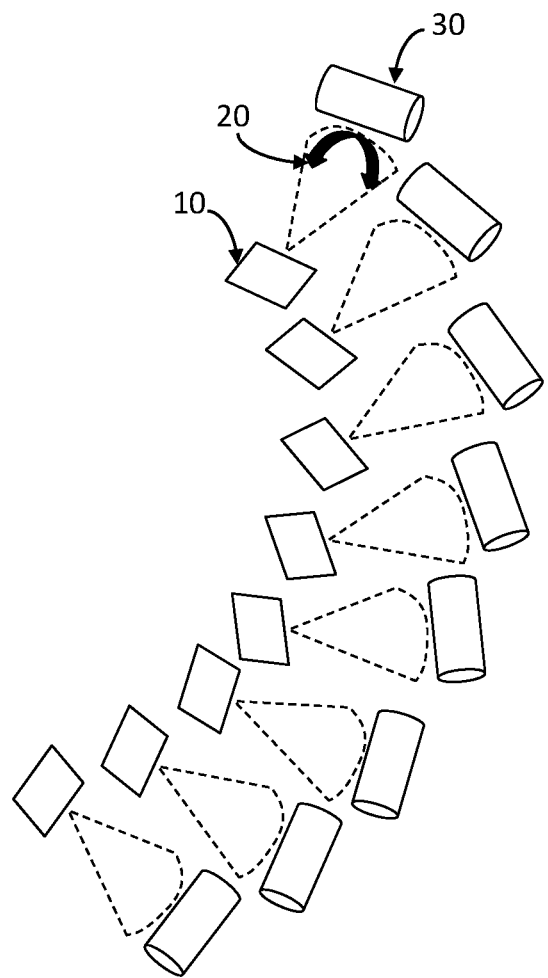
Figure 2:
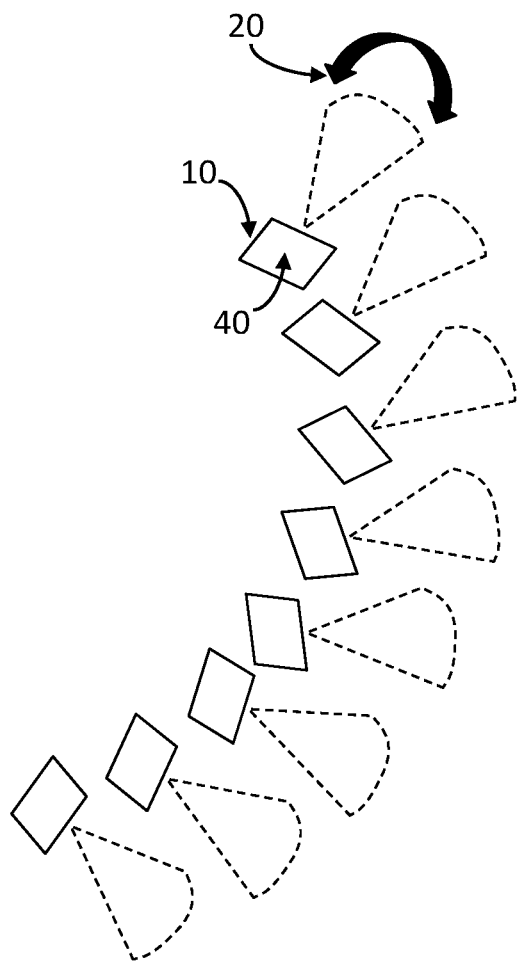

The schematic diagram of FIG. 2 depicts a plurality of 1D planar beam forming and steering optical phased array chips 10. The double-headed arrow 20 lies in the steering plane within the field of view. The spot size in the dimension perpendicular to the steering direction is reduced with an on-chip grating 40.

DETAILED DESCRIPTION OF THE INVENTION

A lidar-based apparatus and method are used for the solid state steering of laser beams using Photonic Integrated Circuits (PICs). Integrated optic design and fabrication micro- and nanotechnologies are used for the production of chip-scale optical splitters that distribute an optical signal from a laser essentially uniformly to an array of pixels, said pixels comprising tunable optical delay lines and optical antennas. Said antennas achieve out-of-plane coupling of light.

As the delay lines of said antenna-containing pixels in said array are tuned, each antenna emits light of a specific phase to form a desired far-field radiation pattern through interference of these emissions. Said array serves the function of solid state optical phased array (OPA).

By incorporating a large number of antennas, high-resolution far-field patterns can be achieved by an OPA, supporting the radiation pattern beam forming and steering needed in solid state lidar, as well as the generation of arbitrary radiation patterns as needed in three-dimensional holography, optical memory, mode matching for optical space-division multiplexing, free space communications, and biomedical sciences. Whereas imaging from an array is conventionally transmitted through the intensity of the pixels, the OPA allows imaging through the control of the optical phase of pixels that receive coherent light waves from a single source.

A plurality of one-dimensional (1D) planar beam forming and steering optical phased array chips are simple building blocks of the transmitter in a solid-state lidar, enabling manufacturing of lidars with high yields and at low cost.

The vertical dimension (i.e., the dimension perpendicular to the steering direction) of the spot size of each said chip is reduced with at least one off-chip lens or at least one on-chip grating.

Types of said off-chip lens include but are not limited to:
Refractive lens
Graded-index (GRIN) lens
Diffractive optical element (DOE)
Holographic optical element (HOE)

Each chip containing an OPA PIC is preferably compatible with a complementary metal-oxide-semiconductor (CMOS) process.

The optical power coupled into the plurality of chips can originate from a single laser or from a plurality of lasers.

What is claimed is:

1. A method, comprising:
   forming an emitter array of one-dimensional planar beam forming and steering optical phased array photonic integrated circuit chips in a first vertical dimension, each photonic integrated circuit chip emitting optical phase controlled unmodulated pulses of coherent light waves that interfere with each other to form an optical beam pointed in a plurality of directions in a second dimension perpendicular to the first vertical dimension; and
   collecting at a receiver array reflected pulses indicative of the distance and the reflectivity of a sensed object, the distance of the sensed object establishing a third dimension.

2. The method of claim 1 further comprising utilizing at least one off-chip lens.

3. The method of claim 2 wherein the off-chip lens is selected from a refractive lens, a graded index lens, a diffractive optical element and a holographic optical element.

4. The method of claim 1 further comprising utilizing at least one on-chip grating.

5. The method of claim 1 wherein the unmodulated pulses of coherent light waves are generated from a single laser.

6. The method of claim 1 wherein the unmodulated pulses of coherent light waves are generated by a plurality of lasers, with the optical input into each photonic integrated circuit chip being generated from one of the plurality of lasers.

* * * * *